United States Patent
Liu et al.

(10) Patent No.: US 10,706,531 B2
(45) Date of Patent: Jul. 7, 2020

(54) ELECTRONIC DEVICE AND METHOD FOR CHECKING DISPENSING OF GLUE IN RELATION TO CIRCUIT BOARD

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Eddy Liu, New Taipei (TW); Xi-Hang Li, Zhengzhou (CN); Jun-Kang Fang, Zhengzhou (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 136 days.

(21) Appl. No.: 15/854,683

(22) Filed: Dec. 26, 2017

(65) Prior Publication Data
US 2018/0189940 A1   Jul. 5, 2018

(30) Foreign Application Priority Data
Dec. 30, 2016 (CN) .......................... 2016 1 1263598

(51) Int. Cl.
| G06T 7/00 | (2017.01) |
| G06T 7/13 | (2017.01) |
| H05K 13/04 | (2006.01) |
| H05K 13/08 | (2006.01) |

(52) U.S. Cl.
CPC ................ *G06T 7/001* (2013.01); *G06T 7/13* (2017.01); *H05K 13/0469* (2013.01); *H05K 13/0815* (2018.08); *G06T 2207/10024* (2013.01); *G06T 2207/10064* (2013.01); *G06T 2207/30141* (2013.01)

(58) Field of Classification Search
None
See application file for complete search history.

(56) References Cited

U.S. PATENT DOCUMENTS

| 5,127,727 A | * | 7/1992 | Arnold ............... G01N 21/8806 356/237.1 |
| 2002/0057830 A1 | * | 5/2002 | Akin .................... G01R 31/309 382/147 |
| 2003/0016859 A1 | * | 1/2003 | Weisgerber ........ H05K 13/0817 382/150 |

(Continued)

FOREIGN PATENT DOCUMENTS

WO   WO1988005909 A1 *   2/1988

*Primary Examiner* — Jiangeng Sun
(74) *Attorney, Agent, or Firm* — ScienBiziP, P.C.

(57) ABSTRACT

A method for checking the proper dispensation of glue onto a circuit board in manufacture includes the use of fluorescent materials in such glue, activating a light source to illuminate a circuit board when the circuit board is placed on an electronic device, and controlling an image capturing device to capture an image of the circuit board. The image captured by the capturing device is compared with a standard stored image of the circuit board, and a determination is made as to whether the circuit board passes test according to the comparison.

16 Claims, 2 Drawing Sheets

(56) References Cited

U.S. PATENT DOCUMENTS

2007/0019186 A1* 1/2007 Sung ................. G01N 21/8806
356/237.5
2014/0009602 A1* 1/2014 Lin ..................... G01C 11/025
348/135

* cited by examiner

ELECTRONIC DEVICE AND METHOD FOR CHECKING DISPENSING OF GLUE IN RELATION TO CIRCUIT BOARD

CROSS-REFERENCE TO RELATED APPLICATIONS

This application claims priority to Chinese Patent Application No. 201611263598.9 filed on Dec. 30, 2016, the contents of which are incorporated by reference herein.

FIELD

The subject matter herein generally relates to printed circuit board technology, and particularly to an electronic device and a method for checking dispensing of glue in relation to a circuit board.

BACKGROUND

Printed circuit boards are widely used in various electronic devices. During a manufacture process of the printed circuit boards, electronic components of the printed circuit board are usually mounted and fixed by dispensing process. However, the dispensed glue is easily redundant, missing, or defective.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
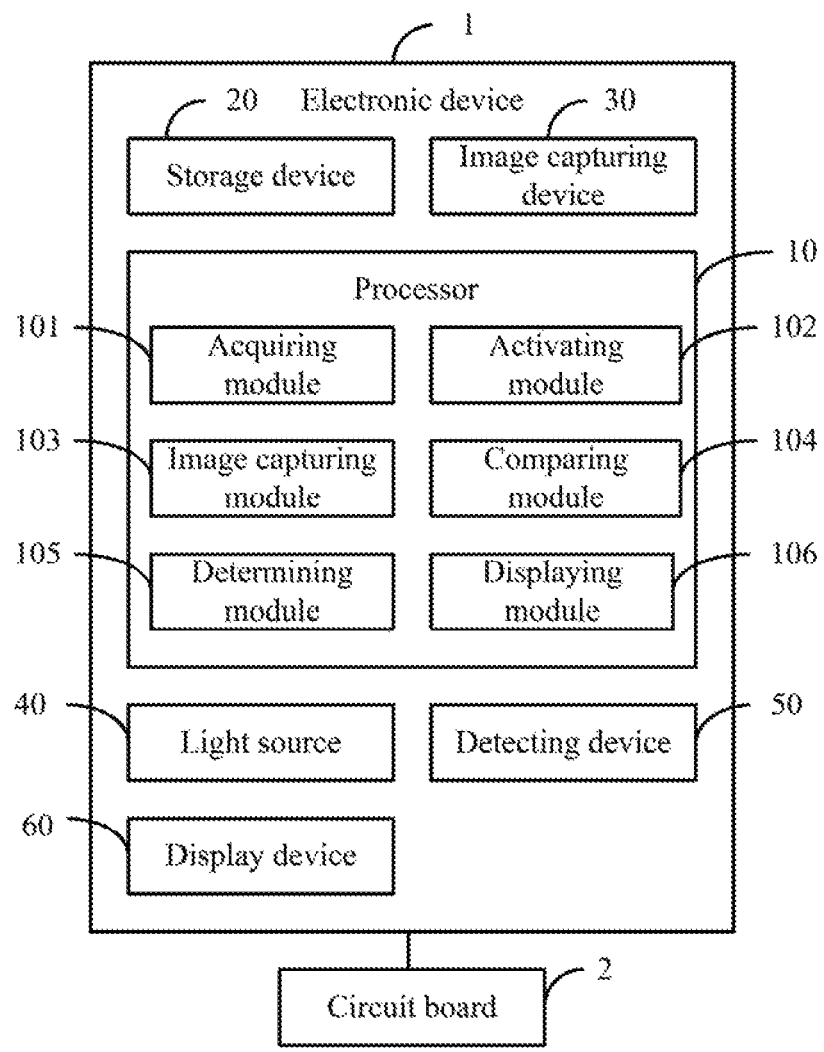
FIG. 1 is a block diagram of an exemplary embodiment of an electronic device for checking dispensing of glue in relation to a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

Furthermore, the term "module", as used herein, refers to logic embodied in hardware or firmware, or to a collection of software instructions, written in a programming language, such as, Java, C, or assembly. One or more software instructions in the modules can be embedded in firmware, such as in an EPROM. The modules described herein can be implemented as either software and/or hardware modules and can be stored in any type of non-transitory computer-readable medium or other storage device. Some non-limiting examples of non-transitory computer-readable media include CDs, DVDs, BLU-RAY, flash memory, and hard disk drives. The term "comprising" means "including, but not necessarily limited to"; it specifically indicates open-ended inclusion or membership in a so-described combination, group, series, and the like.

FIG. 1 illustrates an exemplary embodiment of an electronic device 1. The electronic device 1 is used for checking distribution of glue on a circuit board 2. In at least one exemplary embodiment, for ease of checking, fluorescent materials are added into glue applied to the circuit board 2.

The electronic device 1 includes, but is not limited to, a processor 10, a storage device 20, an image capturing device 30, and a light source 40. In at least one exemplary embodiment, the electronic device 1 can be an AOI (Automatic Optic Inspection) device. FIG. 1 illustrates only one example of the electronic device 1, other examples can include more or fewer components than illustrated, or have a different configuration of the various components in other embodiments.

The at least one processor 10 can be a central processing unit (CPU), a microprocessor, or other data processor chip that performs functions of the electronic device 1.

In at least one exemplary embodiment, the storage device 20 can include various types of non-transitory computer-readable storage mediums. For example, the storage device 20 can be an internal storage system, such as a flash memory, a random access memory (RAM) for temporary storage of information, and/or a read-only memory (ROM) for permanent storage of information. The storage device 20 can also be an external storage system, such as a hard disk, a storage card, or a data storage medium.

The storage device 20 is used for storing a number of standard images of circuit boards 2 of different types. In at least one exemplary embodiment, the standard images of the circuit boards are images of the circuit boards 2 which have glue distributed according to predefined standards.

In at least one exemplary embodiment, the image capturing device 30 can be a camera. The image capturing device 30 is used for capturing images of the circuit boards 2 to be checked.

In at least one exemplary embodiment, the light source 40 can be an ultraviolet light source. The light source 40 is used for providing light.

In at least one exemplary embodiment, the electronic device 1 further includes a supporting member (not shown). The supporting member carries the circuit boards 2 to be checked. The electronic device 1 further defines a detecting device 50 near the supporting member. In at least one exemplary embodiment, the detecting device 50 can be an infrared sensor. When a circuit board 2 to be checked is placed on the supporting member, the detecting device 50 can detect the circuit board 2, and transmit a signal to the processor 10.

As illustrated in FIG. 1, the electronic device 1 includes an acquiring module 101, an activating module 102, an image capturing module 103, a comparing module 104, a determining module 105, and a displaying module 106. The modules 101-106 can be collections of software instructions stored in the storage device 20 of the electronic device 1 and executed by the processor 10. The modules 101-106 also can include functionality represented as hardware or integrated circuits, or as software and hardware combinations, such as a special-purpose processor or a general-purpose processor with special-purpose firmware.

The acquiring module 101 is used to acquire information as to a type of the circuit board 2 when the circuit board 2 is placed on the electronic device 1.

In at least one exemplary embodiment, when the processor 10 receives the signal from the detecting device 50, the acquiring module 101 determines that the circuit board 2 is placed on the electronic device 1.

In at least one exemplary embodiment, the circuit board 2 defines an RFID (Radio Frequency Identification) tag on a predefined position. The acquiring module 101 acquires the information as to type by recognizing the RFID tag. In other exemplary embodiments, the acquiring module 101 can further acquire name and manufacturing date information by recognizing the RFID tag. Relevant information including the information as to type can also be manually input to the electronic device 1 by a user.

The acquiring module 101 further acquires a standard image of the circuit board 2 corresponding to the acquired information as to type from the storage device 20.

The activating module 102 is used to activate the light source 40 to illuminate the circuit board 2 when the circuit board 2 is placed on the electronic device 1.

In at least one exemplary embodiment, the fluorescent materials added into the glue respond to ultraviolet fluorescer. When being illuminated by the ultraviolet light source 40, the fluorescent materials glow, and clearly indicate the distribution of glue of the circuit board 2.

The capturing module 103 is used to control the image capturing device 30 to capture an image of the circuit board 2. In at least one exemplary embodiment, the image capturing device 30 scans and captures the full image of the circuit board 2.

The comparing module 104 is used to compare the image captured by the capturing device 30 with the standard image of the circuit board acquired by the acquiring module 101.

In at least one exemplary embodiment, the comparing module 104 compares the two images by contour contrast. In detail, the comparing module 104 detects an edge of the glue in the captured image of the circuit board 2 and determines a glue region in the captured image. The comparing module 104 further marks an image contour of the glue region by grey process and binarization process, and extracts the marked image contour. The comparing module 104 further compares the extracted image contour with a glue image contour in the standard image of the circuit board, and determines whether the two glue image contours are the same.

In other exemplary embodiments, the comparing module 104 can also compare the image captured by the capturing device 30 with the standard image of the circuit board by gray scale contrast or color contrast.

The determining module 105 is used to determine whether the circuit board 2 should pass test according to a comparison of the comparing module 104.

In at least one exemplary embodiment, when a proportion of the same region occupied in the two glue image contours is greater than or equal to a predetermined percent, the determining module 105 determines that the circuit board 2 should pass the test. When the proportion of the same region occupied in the two glue image contours is less than the predetermined percent, the determining module 105 determines that the circuit board 2 does not pass the test. In at least one exemplary embodiment, the predetermined percent can be ninety percent. In other exemplary embodiments, the predetermined percent can be any other suitable value.

In other exemplary embodiments, the glue image contour includes a number of predetermined positions, the predetermined positions are positions in which dispensed glue cannot or should not exist. When the glue image contours in the number of predetermined positions of the captured circuit board image are the same as those of the standard image of the circuit board, the determining module 105 determines that the circuit board 2 can pass the test. When the glue image contours in the one or more predetermined positions of the captured circuit board image are different from the glue image contours in the corresponding predetermined positions of the standard image of the circuit board, the determining module 105 determines that the circuit board 2 does not pass the test.

The electronic device 1 further includes a display device 60. In at least one exemplary embodiment, the display device 60 can be a LCD (Liquid Crystal Display) screen. The displaying module 106 is used to display a result of test and abnormal regions of the circuit board 2 on the display device 60.

Figure 2:
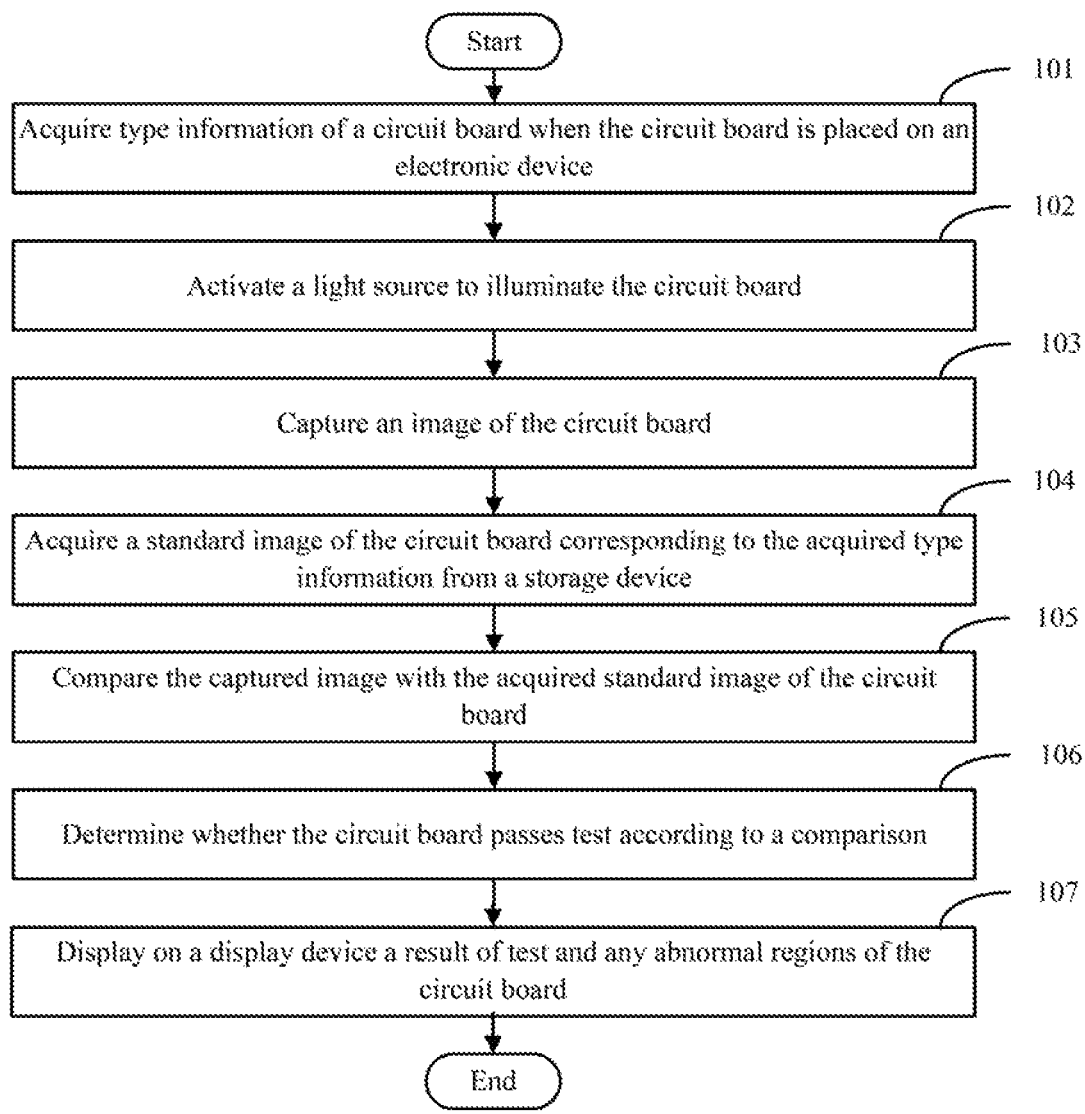
FIG. 2 illustrates a flowchart of an exemplary embodiment of a method for for checking dispensing of glue in relation to a circuit board.

FIG. 2 illustrates a flowchart of an exemplary embodiment of a method for dispensing checking of a circuit board. The method is provided by way of example, as there are a variety of ways to carry out the method. The method described below can be carried out using the configurations illustrated in FIG. 1, for example, and various elements of these figures are referenced in explaining the example method. Each block shown in FIG. 2 represents one or more processes, methods, or subroutines carried out in the example method.

Furthermore, the illustrated order of blocks is by example only and the order of the blocks can be changed. Additional blocks may be added or fewer blocks may be utilized, without departing from this disclosure. The example method can begin at block 101.

At block 101, an acquiring module acquires information as to type of a circuit board, when the circuit board 2 is placed on an electronic device.

At block 102, an activating module activates a light source to illuminate the circuit board, when the circuit board is placed on the electronic device.

At block 103, an image capturing module controls an image capturing device to capture an image of the circuit board.

At block 104, the acquiring module further acquires a standard image of the circuit board corresponding to the acquired information as to type from a storage device.

At block 105, a comparing module compares the image captured by the image capturing device with the standard image of the circuit board acquired by the acquiring module.

At block 106, a determining module determines whether the circuit board passes the test according to the comparison.

At block 107, a displaying module displays on a display device a result of test and any abnormal regions of the circuit board.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. An electronic device comprising:
   at least one processor;
   an image capturing device coupled to the at least one processor;
   a light source coupled to the at least one processor; and
   a storage device coupled to the at least one processor and storing instructions for execution by the at least one processor to cause the at least one processor to:
   activate, when a circuit board is placed on the electronic device, the light source to illuminate the circuit board;
   control the image capturing device to capture a circuit board image;
   extract a glue image contour of the captured circuit board image, wherein the glue image contour comprises a plurality of predetermined positions;
   compare the extracted glue image contour with a glue image contour of a standard image of the circuit board acquired from the storage device; and
   determine, when the glue image contours in the plurality of predetermined positions of the captured circuit board image are the same as the glue image contours in the plurality of corresponding predetermined positions of the standard image of the circuit board, that the circuit board passes the test.

2. The electronic device according to claim 1, further comprising a display device, wherein the at least one processor is further caused to:
   display on a display device a result of test and any abnormal regions of the circuit board.

3. The electronic device according to claim 1, wherein the at least one processor is caused to:
   compare the captured image with the acquired standard image of the circuit board by contour contrast, gray scale contrast, or color contrast.

4. The electronic device according to claim 1, wherein the at least one processor is caused to:
   detect an edge of glue in the captured image of the circuit board;
   determine a glue region in the captured image;
   mark an image contour of the glue region by grey process and binarization process;
   extract a marked glue image contour.

5. The electronic device according to claim 4, wherein the at least one processor is caused to:
   determine, when a proportion of same region occupied in the two glue image contours is greater than or equal to a predetermined percent, that the circuit board passes the test; and
   determine, when the proportion of the same region occupied in the two glue image contours is less than the predetermined percent, that the circuit board does not pass the test.

6. The electronic device according to claim 1, wherein the at least one processor is caused to:
   determine, when the glue image contours in one or more predetermined positions of the captured circuit board image are different from the glue image contours in the plurality of corresponding predetermined positions of the standard image of the circuit board, that the circuit board does not pass the test.

7. The electronic device according to claim 1, wherein the storage device stores a plurality of standard images of circuit boards with different type information, and the at least one processor is further caused to:
   acquire, when the circuit board is placed on the electronic device, type information of the circuit board; and
   acquire a standard image of the circuit board corresponding to the acquired type information from the storage device.

8. The electronic device according to claim 1, wherein fluorescent materials are added into glue used by the circuit board, the fluorescent materials are ultraviolet fluorescer, the light source is an ultraviolet light source.

9. A method for checking dispensing of glue in relation to a circuit board comprising:
   activating a light source to illuminate a circuit board when the circuit board is placed on an electronic device;
   controlling an image capturing device to capture a circuit board image;
   extracting a glue image contour of the captured circuit board image, wherein the glue image contour comprises a plurality of predetermined positions;
   comparing the extracted glue image contour with a glue image contour of a standard image of the circuit board acquired from a storage device; and
   determining, when the glue image contours in the plurality of predetermined positions of the captured circuit board image are the same as the glue image contours in the plurality of corresponding predetermined positions of the standard image of the circuit board, that the circuit board passes the test.

10. The method according to claim 9, further comprising:
    displaying on a display device a result of test and any abnormal regions of the circuit board.

11. The method according to claim 9, further comprising:
    comparing the captured image with the acquired standard image of the circuit board by contour contrast, gray scale contrast, or color contrast.

12. The method according to claim 9, wherein a method of extracting the glue image contour of the captured circuit board image comprises:
    detecting an edge of glue in the captured image of the circuit board;
    determining a glue region in the captured image;
    marking an image contour of the glue region by grey process and binarization process;
    extracting a marked glue image contour.

13. The method according to claim 12, further comprising:
    determining that the circuit board passes the test, when a proportion of same region occupied in the two glue image contours is greater than or equal to a predetermined percent; and
    determining that the circuit board does not pass the test, when the proportion of the same region occupied in the two glue image contours is less than the predetermined percent.

14. The method according to claim 1, further comprising:
    determining that the circuit board does not pass the test, when the glue image contours in one or more predetermined positions of the captured circuit board image are different from the glue image contours in the plurality of corresponding predetermined positions of the standard image of the circuit board.

15. The method according to claim 9, further comprising:
    acquiring type information of the circuit board when the circuit board is placed on the electronic device; and acquiring a standard image of the circuit board corresponding to the acquired type information from the storage device.

16. The method according to claim 9, wherein fluorescent materials are added into glue used by the circuit board, the fluorescent materials are ultraviolet fluorescer, the light source is an ultraviolet light source.

* * * * *